(12) United States Patent
Karpov et al.

(10) Patent No.: US 8,130,536 B2
(45) Date of Patent: Mar. 6, 2012

(54) READ WINDOW IN CHALCOGENIDE SEMICONDUCTOR MEMORIES

(75) Inventors: Ilya V. Karpov, Santa Clara, CA (US); Sergey Kostylev, Bloomfield Hills, MI (US); George A. Gordon, San Jose, CA (US); Ward D. Parkinson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 638 days.

(21) Appl. No.: 11/595,055

(22) Filed: Nov. 9, 2006

(65) Prior Publication Data

US 2008/0112217 A1 May 15, 2008

(51) Int. Cl.
*G11C 11/00* (2006.01)

(52) U.S. Cl. .......................................... 365/163; 365/148

(58) Field of Classification Search .................... 365/46, 365/100, 148, 163, 94, 113, 129; 257/2–5, 257/296, E31.047, E27.006; 438/95, 96, 438/365, 482, 486, 597, 29, 166, 259; 275/5; 977/754

See application file for complete search history.

(56) References Cited

U.S. PATENT DOCUMENTS

| | | | | |
|---|---|---|---|---|
| 6,545,903 B1* | 4/2003 | Wu | | 365/148 |
| 2004/0202017 A1* | 10/2004 | Lee | | 365/163 |
| 2005/0030787 A1* | 2/2005 | Lowrey et al. | | 365/163 |
| 2006/0097240 A1* | 5/2006 | Lowrey et al. | | 257/5 |
| 2006/0279979 A1* | 12/2006 | Lowrey et al. | | 365/148 |

OTHER PUBLICATIONS

Ovonyx presentation "Ovonic Unified Memory." Mar. 2001 unless noted otherwise. 64 pages.*

* cited by examiner

*Primary Examiner* — Richard Elms
*Assistant Examiner* — Harry W Byrne
(74) *Attorney, Agent, or Firm* — Trop, Pruner & Hu, P.C.

(57) ABSTRACT

Using a shorter read pulse width may increase read window in some embodiments. This may allow the use of higher voltages with less likelihood of a read disturb where a bit unintentionally changes phase.

9 Claims, 2 Drawing Sheets

READ PULSE

RESET WRITE
$(t_2 = t_1, V_2 > V_1)$

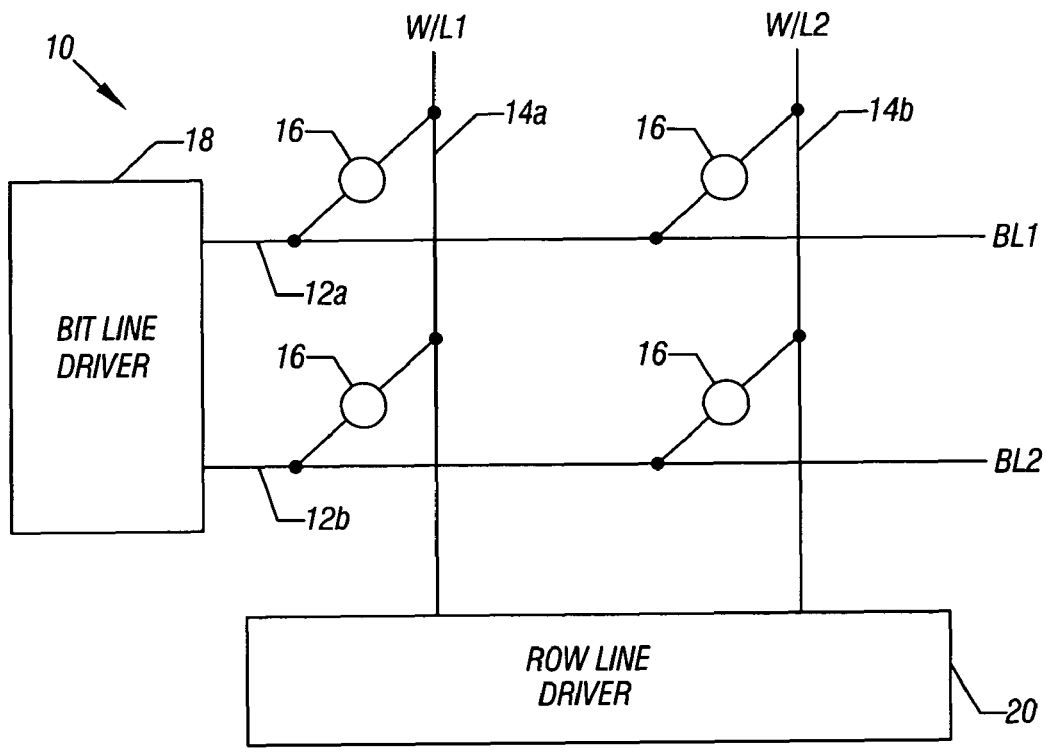
FIG. 1
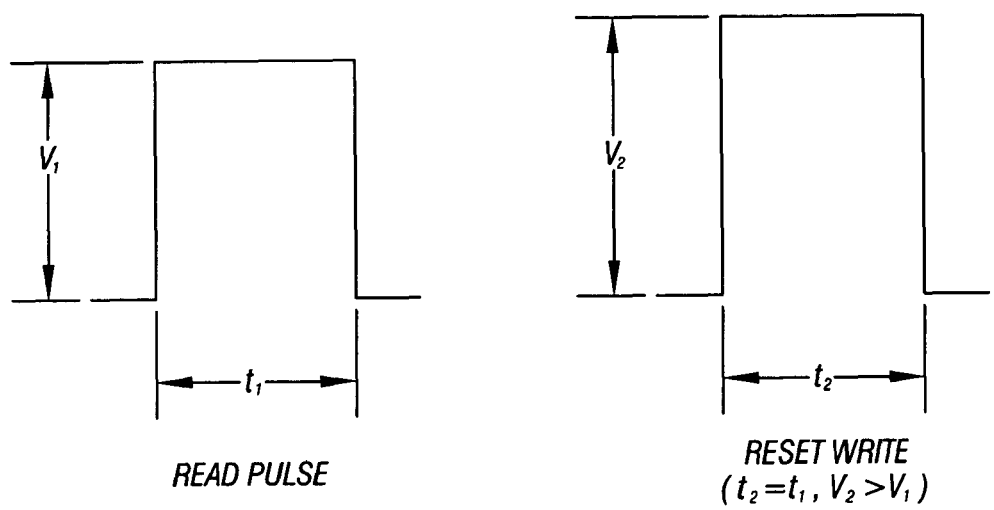
READ PULSE
FIG. 2
RESET WRITE
($t_2 = t_1$, $V_2 > V_1$)
FIG. 3

READ WINDOW IN CHALCOGENIDE SEMICONDUCTOR MEMORIES

BACKGROUND

This invention relates generally to semiconductor memories which include chalcogenide alloys such as phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

BRIEF DESCRIPTION OF THE DRAWINGS

FIG. 1 is a depiction of a phase change memory in accordance with one embodiment of the present invention;

FIG. 2 is a depiction of a read pulse in accordance with one embodiment of the present invention for reading bits in the memory as shown in FIG. 1;

FIG. 3 is a reset write pulse for writing a reset bit in the memory shown in FIG. 1 in accordance with one embodiment of the present invention;

DETAILED DESCRIPTION

Figure 4:
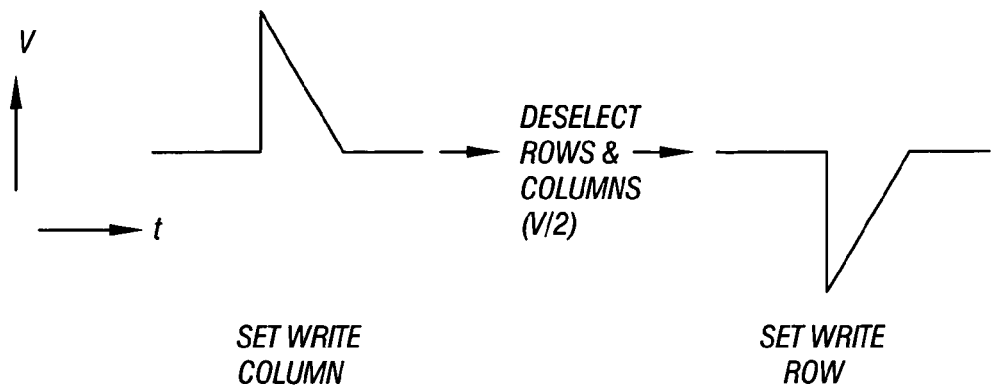
FIG. 4 shows a sequence for writing a set bit by biasing row and column.

In accordance with some embodiments of the present invention, the read window or margin for chalcogenide semiconductor memories may be increased. The window defines by how much the applied voltage pulse amplitude can vary while still allowing reliable reading and writing of the cells. Increasing the window is advantageous. The window determines how large a voltage can be used to read or write a memory bit without the risk of disturbing the memory bit or any of the bits on the deselected columns or rows while reading or writing. A disturb occurs when the bit changes state inappropriately as a result of a read or write operation.

A phase change memory may include many cells that include a chalcogenide containing ovonic memory element coupled in series to an ovonic threshold switch. The ovonic memory element may change phase in response to programming currents applied to it, while the ovonic threshold switch acts as a selection device and, while it may contain a chalcogenide alloy, does not generally change phase.

Generally, the ovonic memory element may be read by a voltage pulse with an amplitude between the threshold voltage of the ovonic threshold switch and a voltage which is the sum of the threshold voltages of the ovonic threshold switch and the memory element. Generally, the ovonic threshold switch triggers or switches when the memory is in the set state and does not switch or trigger when the memory is in the reset state. Triggering occurs when the threshold voltage of the threshold switch is exceeded.

Referring to FIG. 1, a chalcogenide semiconductor memory 10 may include a plurality of cells 16. The cells 16 may be composed of an ovonic threshold switch (OTS) in series with an ovonic memory element such as an ovonic unified memory or OUM. The cells 16 are coupled to word lines, such as the word line 14a or 14b, and to a bitline, such as the bitline 12a and 12b. While only two word lines and two bitlines are shown, in a conventional memory a large number of such lines and a great number of such cells may be included.

The word lines 14a, 14b, may be driven by a row line driver 20 and the bitlines 12a, 12b or column lines may be driven by a bitline driver 18. Thus, the memory 10 may be capable of both reading and writing to the various cells 16. Other components may be used as well, including controllers, output circuitry, sense amplifiers, and the like.

In some embodiments the array of cells 16 may be asymmetrical. That is the row or column length may exceed the column or row length respectively. However, conventional symmetrical array may also be used.

Referring to FIGS. 2 and 3, the read pulse may have a certain duration $t_1$ and a pulse amplitude $V_1$. Generally, the cells 16 can be written or rewritten into the lower resistance or crystalline phase or the higher resistance or amorphous phase. The ovonic threshold switch within the cell is a select device to address the cell. The ovonic threshold switch differs from the ovonic memory in that the ovonic threshold switch may not change between amorphous and crystalline phases. Generally, the ovonic threshold switch does not conduct current until the bias applied to the cell exceeds the threshold voltage of the ovonic threshold switch.

An ovonic memory in the reset state exhibits a threshold delay time between the application of an external voltage pulse $V_1$ and the time when the cell thresholds and starts to conduct current. The delay time has a strong non-linear dependence on the applied voltage. Thus, the measured threshold voltage depends on the applied voltage pulse width. Namely, the threshold voltage tends to be higher at lower pulse widths, with the transition to relatively less change with pulse width being at approximately 1E-7 seconds of pulse width in some embodiments.

The read window is negatively impacted by the variability of threshold voltages of the ovonic threshold switch. If the selected bitline, such as the bitline 12b, is forced high while the other bitline, such as the bitline 12a, is biased to prevent deselected bits from turning on, a threshold delay time may be exhibited. For example, the unselected bits may be biased to either a midpoint, one-third voltage of the selected bits or grounded, to mention a few examples. The deselected rows and columns may be kept at the same voltage, such as a midpoint voltage, to confine off state leakage to bits along the selected word line and bitline, or the rows held between midpoint and two-thirds the select voltage for more margin, while the columns are held between midpoint and one-thirds peak voltage applied. Other techniques may also be used to reduce off state leakage and leakage during the read or write operation.

The read window of the cell 16 is the difference between the threshold voltage of the cell when the memory element is reset and the threshold voltage of the cell when the memory element is set. The window is, therefore, approximately equal to the threshold voltage of the ovonic threshold switch plus the threshold voltage of the memory element minus the threshold voltage of the switch or approximately the threshold voltage of the memory element in the reset state. The window is reduced by voltage drops along the selected and deselected lines, as well as any imprecision in setting voltages and currents including changes with temperature or variation in the threshold voltages cell to cell.

A read voltage $V_1$ with a read pulse width $t_1$ may be applied to a selected bitline. A resulting current pulse is sensed in the selected bitline or word line only when the cell is set. That is, if the memory element in series with the switch is set, then a higher current pulse is sensed. The read pulse width is selected based on the desire to increase the threshold voltage of memory device. Generally, this allows increasing the read window. Generally, a shorter read pulse width on the order of less than 70 nanoseconds may be advantageous in some embodiments and a pulse width of approximately 40 nanoseconds, in particular, may be used.

A set slope may be used to write a set bit at substantially the same amplitude as writing a reset bit. However, with a longer pulse duration used to write a set bit, the pulse amplitude may be applied for a longer period of time than that used during a write of a reset bit or a read cycle. For example, a reset pulse trailing edge may be faster than the set pulse trailing edge by more than five times.

To avoid the excessive loss of margin from threshold voltage lowering for some types of pulse shapes while writing set bits at this different pulse width, the amplitude of the write set pulse may be 80 percent or less of the write reset pulse amplitude. Further, this reduction in voltage amplitude during the writing of a set bit may be applied by raising the row line 10 percent of the reset voltage and lowering the column line 10 percent of the reset voltage, so that the voltage across the cell is still 80 percent, but the difference to the deselected row and column is reduced whether, for example, the rows and columns are deselected to half the voltage used for the selected rows and columns or at intermediate ⅓ or ⅔.

Further margin may be gained by applying a voltage of one-third the select voltage to columns and two-thirds the select voltage to rows, but at the expense of increased leakage current between the deselected rows and columns and more limited ability to repair a block for a row to column short.

Further, the reduced margin from declining threshold voltage with pulse time for some types of pulse shapes, while writing set, may be improved by taking the write set pulse high (such as to 90%) and row low (such as to 10%) and immediately reducing symmetrically the voltage across each as the set slope trailing edge total voltage is decreased, as shown in FIG. 4.

Figure 5:
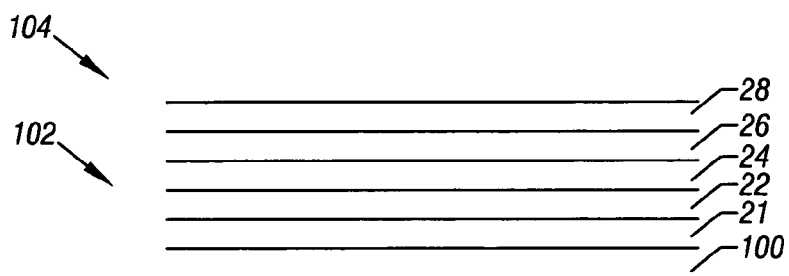
FIG. 5 is a cross-section of a cell according to one embodiment.

Programming of the chalcogenide material 22, shown in FIG. 5, to alter the state or phase of the material may be accomplished by applying voltage potentials to the lower electrode 21, formed on substrate 20, and upper electrode 28, thereby generating a voltage potential across the memory element 102. When the voltage potential is greater than the threshold voltages of memory element, then an electrical current may flow through the chalcogenide material 22 in response to the applied voltage potentials, and may result in heating of the chalcogenide material 22.

This heating may alter the memory state or phase of the chalcogenide material 22. Altering the phase or state of the chalcogenide material 22 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. Both "reset" and "set" states can exist without any energy (electrical, optical, mechanical) applied to bistable material 14. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

A select device 104 may operate as a switch that is either "off" or "on" depending on the amount of voltage potential applied across the cell, and more particularly whether the current through the select device exceeds its threshold current or voltage, which then triggers the device into the on state. The off state may be a substantially electrically nonconductive state and the on state may be a substantially conductive state, with less resistance than the off state.

In the on state, the voltage across the select device 104, in one embodiment, is equal to its holding voltage $V_H$ plus IxRon, where Ron is the dynamic resistance from the extrapolated X-axis intercept, $V_H$. For example, a select device may have threshold voltages and, if a voltage potential less than the threshold voltage of a select device is applied across the select device, then the select device may remain "off" or in a relatively high resistive state so that little or no electrical current passes through the memory cell and most of the voltage drop from selected row to selected column is across the select device. Alternatively, if a voltage potential greater than the threshold voltage of a select device is applied across the select device, then the select device may "turn on," i.e., operate in a relatively low resistive state so that electrical current passes through the memory cell. In other words, one or more series connected select devices may be in a substantially electrically nonconductive state if less than a predetermined voltage potential, e.g., the threshold voltage, is applied across select devices. Select devices may be in a substantially conductive state if greater than the predetermined voltage potential is applied across select devices. Select devices may also be referred to as an access device, an isolation device, or a switch.

In one embodiment, each select device may comprise a switch material 26 such as, for example, a chalcogenide alloy, and may be referred to as an ovonic threshold switch, or simply a switch. The switch material 26 may be sandwiched between electrodes 28 and 24. The switch material 26 of select devices may be a material in a substantially amorphous state positioned between two electrodes that may be repeatedly and reversibly switched between a higher resistance "off" state (e.g., greater than about one megaOhms) and a relatively lower resistance "on" state (e.g., less than about one thousand Ohms) by application of a predetermined electrical current or voltage potential. In this embodiment, each select device 104 may be a two terminal device that may have a current-voltage (I-V) characteristic similar to a phase change memory element that is in the amorphous state. However, unlike a phase change memory element, the monostable switch material 26 of select devices may not change phase. That is, the switching material of select devices may not be a programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or non-conducting, and exhibit a relatively high resistance, e.g., greater than about 1 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current, $I_H$. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. A single select device may have a $V_H$ about equal to its threshold voltage, $V_{TH}$, (a voltage difference less than the threshold voltage of the memory element) to avoid triggering a reset bit when the select device triggers from a threshold voltage to a lower holding voltage called the snapback voltage. An another example, the threshold current of the memory element 102 may be about equal to the threshold current of the access device even though its snapback voltage is greater than the memory element's reset bit threshold voltage.

In one embodiment of the present invention, decreased measured set resistances may be achieved. Conventionally, device scaling results in increased set resistance. Increased set resistance adversely affects margin. When using short read pulses, having pulse widths less than 70 nanoseconds, an increased read pulse amplitude may be utilized. Specifically, read pulse amplitudes greater than 0.5 volts may be used and, particularly, read pulse amplitudes of greater than 0.7 volts may be utilized in some embodiments. In cases where the cell has a relatively low dV/dI, a decrease in measured set resistance may be achieved. Particularly, where the cell dV/dI is less than or equal to 300 Ohms, the set resistance may be decreased.

To give a hypothetical example, it is believed that the set resistance may be decreased to 40 percent of the set resistance at a lower read pulse voltage. For example, in one embodiment, a measured voltage of 0.18 resulted in a set resistance of 10 kiloOhms, while a pulse amplitude of 0.78 resulted in a measured set resistance of 3.39 kiloOhms. The device had a threshold voltage of 1.2 volts, although results in practice may vary. In many cases, short bit lines may be utilized to reduce bit line capacitance to enable short read pulses.

Figure 6:
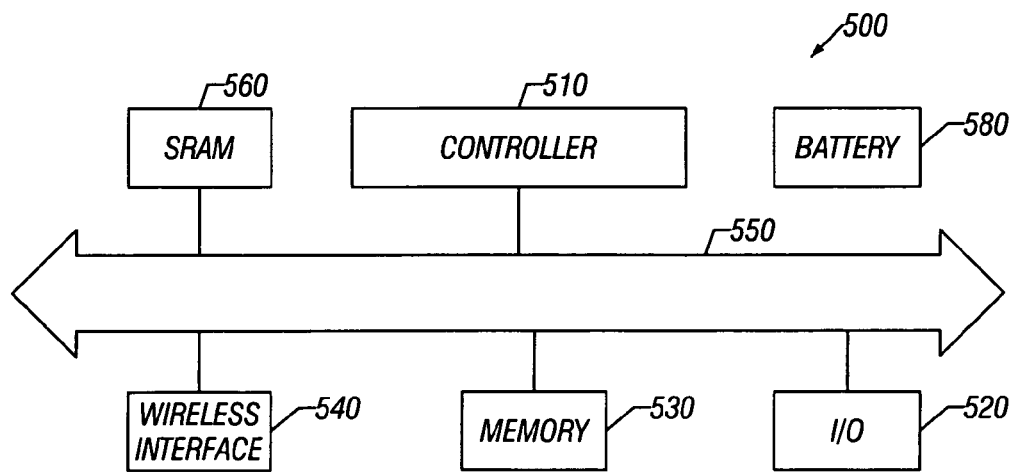
FIG. 6 is a schematic depiction of a system in accordance with one embodiment of the present invention.

Turning to FIG. 6, a portion of a system 500 in accordance with an embodiment of the present invention is described. System 500 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A chalcogenide semiconductor memory comprising:
  a cell including a chalcogenide material and a pair of electrodes sandwiching said chalcogenide material;
  a device to write a set bit using a longer pulse than the pulse used to write a reset bit; and
  a device to write to the cell that uses the same pulse width as the device to read.

2. The memory of claim 1 wherein said device to use a read pulse width of about 40 nanoseconds.

3. The memory of claim 1 including an asymmetrical array of chalcogenide memory cells.

4. The memory of claim 1 including a device to write said cell using a reset pulse trailing edge that is faster than the set pulse trailing edge by more than live limes and a set pulse amplitude difference between the selected hit line and deselected rows of 90 percent or less than the reset pulse amplitude.

5. The memory of claim 4 wherein said device to write using a set pulse amplitude difference between deselected bits and selected rows of 90 percent or less than the reset pulse amplitude.

6. The memory of claim 1 wherein said device to read a lower voltage relative to the voltage used to write a reset hit by said device to write.

7. The memory of claim 1 wherein said device to write uses a set hit write pulse amplitude of 80 percent or less of a reset bit write pulse amplitude.

8. The memory of claim 1 including an ovonic threshold switch coupled in series with said cell.

9. The memory of claim 1, said device to produce a read pulse amplitude greater than 0.5 volts and said cell having a dV/dI equal to or less than 300 Ohms.

* * * * *